United States Patent
Cheng et al.

(10) Patent No.: US 11,837,604 B2
(45) Date of Patent: Dec. 5, 2023

(54) FORMING STACKED NANOSHEET SEMICONDUCTOR DEVICES WITH OPTIMAL CRYSTALLINE ORIENTATIONS AROUND DEVICES

(71) Applicant: International Business Machines Corporation, Armonk, NY (US)

(72) Inventors: Kangguo Cheng, Schenectady, NY (US); Shogo Mochizuki, Mechanicville, NY (US); Juntao Li, Cohoes, NY (US)

(73) Assignee: International Business Machine Corporation, Armonk, NY (US)

( * ) Notice: Subject to any disclaimer, the term of this patent is extended or adjusted under 35 U.S.C. 154(b) by 0 days.

(21) Appl. No.: 17/481,353

(22) Filed: Sep. 22, 2021

(65) Prior Publication Data

US 2023/0099156 A1 Mar. 30, 2023

(51) Int. Cl.
*H01L 27/12* (2006.01)
*H01L 21/84* (2006.01)
*H01L 29/04* (2006.01)
*H01L 27/092* (2006.01)
*H01L 27/06* (2006.01)

(52) U.S. Cl.
CPC .......... *H01L 27/1203* (2013.01); *H01L 21/84* (2013.01); *H01L 27/092* (2013.01); *H01L 29/045* (2013.01); *H01L 27/0688* (2013.01)

(58) Field of Classification Search
CPC . H01L 27/1203; H01L 21/84; H01L 21/8238; H01L 29/42392; H01L 27/0924; H01L 29/045
USPC .......................................... 257/369; 438/199
See application file for complete search history.

(56) References Cited

U.S. PATENT DOCUMENTS

| | | |
|---|---|---|
| 6,310,367 B1 | 10/2001 | Yagishita |
| 7,977,706 B2 | 7/2011 | Lochtefeld |
| 9,318,491 B2 | 4/2016 | Cantoro |
| 9,472,555 B1 | 10/2016 | Balakrishnan |
| 9,583,491 B2 | 2/2017 | Kim |
| 9,711,414 B2 | 7/2017 | Hatcher |
| 9,871,140 B1 | 1/2018 | Balakrishnan |
| 9,887,197 B2 | 2/2018 | Balakrishnan |
| 9,917,015 B2 | 3/2018 | Cheng |

(Continued)

FOREIGN PATENT DOCUMENTS

| | | |
|---|---|---|
| CN | 2005268438 A | 9/2005 |
| CN | 101710584 A | 5/2011 |

(Continued)

OTHER PUBLICATIONS

J. Ryckaert et al., "The Complementary FET (CFET) for CMOS scaling beyond N3," Symposium on VLSI Technology, 2018, 978-1-5386-4218-4 © 2018 IEEE, 2 Pgs.

(Continued)

*Primary Examiner* — Thinh T Nguyen
(74) *Attorney, Agent, or Firm* — Edward J. Wixted, III (57) ABSTRACT

An approach provides a semiconductor structure with a first crystalline surface orientation and a first nanosheet stack on the semiconductor substrate with the first crystalline surface orientation. The semiconductor substrate structure includes a second nanosheet stack with a second crystalline surface orientation above the first nanosheet stack, wherein the first nanosheet stack and the second nanosheet stack are separated by a dielectric material.

14 Claims, 8 Drawing Sheets

(56) References Cited

U.S. PATENT DOCUMENTS

| | | | |
|---|---|---|---|
| 10,283,625 | B2 | 5/2019 | Cheng |
| 10,332,803 | B1 | 6/2019 | Xie |
| 10,347,657 | B1 | 7/2019 | Leobandung |
| 10,381,438 | B2 | 8/2019 | Zhang |
| 10,483,166 | B1 | 11/2019 | Cheng |
| 10,741,456 | B2 | 8/2020 | Cheng |
| 10,892,331 | B2 | 1/2021 | Yamashita |
| 10,930,563 | B2 | 2/2021 | Cheng |
| 10,991,626 | B2 | 4/2021 | Smith |
| 11,018,235 | B2 | 5/2021 | Huynh Bao |
| 2015/0263088 | A1 | 9/2015 | Cheng |
| 2019/0131394 | A1 | 5/2019 | Reznicek |
| 2020/0091287 | A1 | 3/2020 | Glass |
| 2020/0105750 | A1 | 4/2020 | Xiao |
| 2020/0119015 | A1 | 4/2020 | Bi |
| 2020/0219879 | A1* | 7/2020 | Shin et al. .......... H01L 29/6681 |
| 2020/0294866 | A1 | 9/2020 | Cheng |
| 2021/0104523 | A1* | 4/2021 | Fulford et al. ........ H01L 27/924 |
| 2021/0202326 | A1 | 7/2021 | Schwarzenbach |
| 2021/0265508 | A1 | 8/2021 | Chiang |

FOREIGN PATENT DOCUMENTS

| | | | |
|---|---|---|---|
| CN | 106365106 | A | 2/2017 |
| CN | 104126222 | B | 6/2017 |
| CN | 107492552 | A | 12/2017 |
| CN | 106463543 | B | 4/2020 |
| CN | 111566803 | A | 8/2020 |
| KR | 101374485 | B1 | 3/2014 |
| KR | 20160047409 | A | 5/2016 |

OTHER PUBLICATIONS

"Patent Cooperation Treaty PCT Notification of Transmittal of the International Search Report and the Written Opinion of the International Searching Authority, or the Declaration", Applicant's file reference PF220658PCT, International application No. PCT/CN2022/120119, International filing date Sep. 21, 2022 (Sep. 21, 2022), dated Dec. 15, 2022 (dated Dec. 15, 2022), 10 pages.

"Patent Cooperation Treaty PCT Notification of Transmittal of the International Search Report and the Written Opinion of the International Searching Authority, or the Declaration", Applicant's file reference PF220657PCT, International application No. PCT/CN2022/120113, International filing date Sep. 21, 2022 (Sep. 21, 2022), dated Dec. 16, 2022 (dated Dec. 16, 2022), 10 pages.

Cheng et al;, "Dual Strained Semiconductor Substrate and Patterning", U.S. Appl. No. 17/482,573, filed Sep. 23, 2021, 25 Pgs.

IBM Appendix P., "List of IBM Patents or Patent Applications to be Treated as Related", Dated Herewith, 2 pages.

* cited by examiner

FORMING STACKED NANOSHEET SEMICONDUCTOR DEVICES WITH OPTIMAL CRYSTALLINE ORIENTATIONS AROUND DEVICES

BACKGROUND OF THE INVENTION

The present invention relates generally to the field of semiconductor device formation using two vertically stacked nanosheet stacks and more particularly to the formation of vertically stacked N-type and P-type complementary metal-oxide-semiconductor (CMOS) transistors with where each of the transistors has a device optimal crystal orientation.

In order to attain both increased circuit density and required electrical performance, semiconductor device fabrication is increasingly using a number of nanosheets stacks composed of very thin layers of semiconductor or other materials in device formation. In particular, the formation of CMOS devices using nanosheet stacks for advanced device structures with less than ten nanometer feature size is becoming more prevalent. Device fabrication utilizing nanosheet stacks is emerging for gate-all-around (GAA) transistors that can be formed as vertical gate-all-around (vGAA) or horizontal gate-all-around (hGAA) devices. Conventionally, adjacent p-type field-effect transistor (PFETs) structures and n-type field-effect transistor (NFET) structures are fabricated as a single type of GAA devices, such as two adjacent hGAA devices or two vGAA devices where the two adjacent devices are either a PFET hGAA device and an NFET hGAA device or a PFET vGAA device and an NFFET vGAA device. In particular, hGAA devices employing nanosheet stacks are becoming more prevalent as feature sizes in CMOS devices continue to scale downward.

SUMMARY

Embodiments of the present invention disclose a semiconductor substrate structure with a first crystalline surface orientation and a first nanosheet stack on the semiconductor substrate with the first crystalline surface orientation. The semiconductor substrate structure includes a second nanosheet stack with a second crystalline surface orientation above the first nanosheet stack, wherein the first nanosheet stack and the second nanosheet stack are separated by a dielectric material.

Embodiments of the present invention disclose a semiconductor device structure where the semiconductor device is composed of a p-type field-effect transistor and a n-type field-effect transistor that are vertically stacked in a complementary metal-oxide-semiconductor device (CMOS) device. The semiconductor device structure includes a semiconductor substrate, a p-type field-effect transistor with a first crystalline surface orientation in a channel material in a first nanosheet stack; and an n-type field-effect transistor with a second crystalline surface orientation in a channel material in a second nanosheet stack where the first crystalline surface orientation provides a preferred crystal orientation of the p-type channel material and the second crystalline surface orientation provides the preferred crystal orientation of the n-type channel material. The p-type field-effect transistor and the n-type field-effect transistor are vertically aligned and isolated by a dielectric material. Embodiments of the present invention provide the semiconductor device that is a stacked CMOS with a gate-all-around semiconductor device structure.

Embodiments of the present invention provide a method of forming a semiconductor substrate structure with two nanosheet stacks where each of the two nanosheet stacks has a different crystalline surface orientation. The method includes epitaxially growing a first nanosheet stack of alternating nanosheet layers of a sacrificial semiconductor material and a channel semiconductor material on a first semiconductor substrate with a first crystalline surface orientation. The method includes epitaxially growing a second nanosheet stack alternating nanosheet layers of the sacrificial semiconductor material and the channel semiconductor material on a second semiconductor substrate with a second crystalline surface orientation. The method includes depositing a dielectric layer on a top layer of the sacrificial semiconductor material in one of the first nanosheet stack or the second nanosheet stack and bonding a top surface of the first nanosheet stack to a top surface of the second nanosheet stack. The method includes removing one of the first semiconductor substrate or the second semiconductor substrate from under one of the first nanosheet stack or the second nanosheet stack that are bonded together.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Embodiments of the present invention recognize that stacked complementary metal-oxide-semiconductor (CMOS) devices are emerging as a method to increase transistor density. Embodiments of the present invention recognize that stacked CMOS devices are conventionally formed by stacking n-type field-effect transistors (NFET) and p-type field-effect transistors (PFET) on top of each other in the CMOS device. Embodiments of the present invention recognize that the performance of CMOS devices is strongly dependent on the crystalline orientation of the device channel. NFET and PFET have different preferred crystalline orientations that provide optimal electrical performance. In NFETs, a {100} crystalline surface orientation for the channel material is preferred for optimal electrical performance. In PFETs, a {110} crystalline surface orientation for the channel material is preferred for optimal electrical performance. Embodiments of the present invention recognize that typical CMOS devices are formed using conventional nanosheet stacks where the NFET and PFETs are both formed with semiconductor nanosheet layers with the same crystalline surface orientation. As known to one skilled in the art, the {100} and the {110} crystalline surface orientation use Miller indices to identify a set of lattice planes in crystallography or material science and that in particular, the family of lattice planes is determined by three integers h, k, and ℓ that are known as the Miller indices.

In conventional stacked CMOS devices, such as hGAA, the NFET and the PFET devices are typically formed using a single nanosheet stack. In the nanosheet stack, the crystalline surface orientation of the channel material is typically a {100} crystalline surface orientation. Embodiments of the present invention recognize that forming stacked CMOS devices with NFET and PFET hGAA devices with a single nanosheet stack that has a {100} crystalline surface orientation for channel material results in reduced electrical performance of the PFET hGAA device. Embodiments of the present invention recognize that a method of forming stacked CMOS devices that include a PFET hGAA device with a {110} crystalline surface orientation for the PFET device channel and an NFET hGAA device formed with a {100} crystalline surface orientation in the NFET device channel is desirable to improve the performance of stacked CMOS devices.

Embodiments of the present invention provide a method of forming a semiconductor substrate that provides two vertically stacked nanosheet stacks where the first nanosheet stack has one crystalline surface orientation and a second nanosheet stack has a second crystalline surface orientation. Embodiments of the present invention provide the semiconductor substrate structure with two nanosheet stacks where each of the nanosheet stacks is composed of alternating nanosheet layers of a sacrificial material, such as a silicon-germanium layer and a channel material layer, such as a layer of silicon. While the crystal orientation of each layer in each nanosheet stack is the same, embodiments of the present invention provide a semiconductor substrate structure with two nanosheet stacks where the crystal orientation of the two nanosheet stacks is different.

Embodiments of the present invention provide the first nanosheet stack with a crystalline surface orientation providing an optimal electrical performance for one type of transistor in a stacked CMOS device. The second nanosheet stack has the crystalline surface orientation providing an optimal electrical performance for a second type of transistor in the stacked CMOS device. More specifically, embodiments of the present invention provide a semiconductor substrate structure where each layer of one nanosheet stack has a {110} crystalline surface orientation that is preferred for PFET hGAA device performance and where each layer of the other nanosheet stack has a {110} crystalline orientation that is preferred for NFET hGAA device performance. The two nanosheet stacks are separated by a dielectric material layer in embodiments of the present invention. The two nanosheet stacks are above a base semiconductor substrate or wafer with a first crystalline surface orientation where the first nanosheet stack on the wafer also has the first crystalline surface orientation.

Embodiments of the present invention provide the semiconductor substrate structure where the first nanosheet stack has a {100} crystalline surface orientation in the channel material. Embodiments of the present invention also provide the second nanosheet stack with a {110} crystalline surface orientation when the first nanosheet stack has a {100} crystalline surface orientation in the channel material. In this way, embodiments of the present invention provide a semiconductor structure with two different crystalline orientations for the nanosheet stacks, and therefore, the semiconductor substrate can provide preferred crystalline orientations for both PFETs and NFETs in stacked CMOS devices formed from the semiconductor substrate.

Embodiments of the present invention provide a method of forming the semiconductor substrate structure with two nanosheet stacks where each nanosheet stack has a different crystal orientation. Each of the nanosheet stacks is epitaxially grown on a base semiconductor substrate or wafer and will have the same crystal orientation as the base semiconductor substrate the nanosheet stack is grown on. The method includes using two different base semiconductor substrates or wafers with two different crystal orientations to grow the two nanosheet stacks where one nanosheet stack is grown on one base semiconductor substrate and the second nanosheet stack is grown on the second base semiconductor substrate.

Embodiments of the present invention provide a method of using epitaxy to grow one nanosheet stack with a crystalline surface orientation that matches the crystalline surface orientation of the base semiconductor substrate or wafer on which the nanosheet stack is formed and growing a second nanosheet stack on a second base semiconductor substrate with a different crystalline surface orientation. Embodiments of the present invention provide the method where when the base semiconductor substrate has a {100} crystalline surface orientation, then the nanosheet stack grown on the semiconductor substrate has a {100} crystalline surface orientation. A {100} crystalline surface orientation is preferred for NFET electrical performance. When the second semiconductor substrate or wafer has a {110} crystalline surface orientation, then the second nanosheet stack grown on the second semiconductor substrate or wafer has a {110} crystalline orientation. A {110} crystalline surface orientation of the second nanosheet stack is preferred for PFET electrical performance. Embodiments of the present invention also provide the method where when the base semiconductor substrate has a {110} crystalline surface orientation, then the nanosheet stack grown on the semiconductor substrate has a {110} crystalline surface orientation.

After growing the nanosheet stacks, the method includes depositing a dielectric material, such as an oxide layer by chemical vapor deposition, physical vapor deposition, atomic layer deposition, or another known semiconductor manufacturing deposition method on the top surface of one or both of the two nanosheet stacks formed on the two semiconductor substrates. After depositing the oxide layer, the two semiconductor substrates or wafers are bonded together (e.g., the top surface of one of the nanosheet stacks is joined to dielectric material on the other nanosheet stack). The wafer bonding joins the top surface of the dielectric material on one nanosheet stack to the top surface of the second nanosheet stack. One of the two semiconductor substrates is removed from the semiconductor stack of the two joined nanosheet stacks. After removing one of the two semiconductor substrates or wafers, the two nanosheet stacks reside on the remaining semiconductor substrate. Embodiments of the present invention provide a single semiconductor substrate structure where two nanosheet stacks with different crystalline surface orientations are vertically stacked on a wafer or substrate and are electrically isolated from each other by a dielectric material.

Embodiments of the present invention provide the semiconductor substrate with one of a {110} or a {100} crystalline surface orientation and a first nanosheet stack is on the semiconductor substrate with the same crystalline surface orientation as the semiconductor substrate. The first nanosheet stack is under a dielectric material, such as an oxide layer. When the first nanosheet stack has a {110} crystalline surface orientation then, the second nanosheet stack that is on the dielectric material has a {100} crystalline surface orientation in the channel material. In other embodiments, the second nanosheet stack has a {110} crystalline surface orientation when the first nanosheet stack has a {100} crystalline surface orientation in the channel material.

Using the semiconductor substrate with two stacked and electrically isolated nanosheet stacks where one of the two nanosheet stacks has a {110} crystalline surface orientation and the other nanosheet stack has a {100} crystalline surface orientation, embodiments of the present invention provide a semiconductor device structure and a method of forming a stacked CMOS device with a vertically aligned PFET and NFET that each has a preferred crystalline surface orientation in the channel material. Using the method of forming the semiconductor substrate described in detail above provides the stacked CMOS device with a PFET with a channel material that has a preferred {110} crystalline surface orientation and the NFET with a channel material that has a preferred {100} crystalline surface orientation. In this way, the stacked CMOS device formed from the semiconductor substrate structure with two nanosheet stacks with two different crystal orientations provides improved electrical performance for the stacked CMOS device. Embodiments of the present invention use semiconductor device formation processes and the semiconductor substrate with two vertically stacked nanosheet stacks with two different crystal orientations to form the stacked CMOS device. Embodiments of the present invention provide a method of forming a semiconductor device structure and a semiconductor device structure for a stacked CMOS device using a horizontal gate-all-around (hGAA) device structure although the methods described hereinafter are not limited to hGAA devices but, may be applied to other types of CMOS devices as well. The PFET hGAA device has a channel material with a {110} crystalline surface orientation and the NFET hGAA device in the stacked CMOS has a channel material with a {100} crystalline orientation.

The following description with reference to the accompanying drawings is provided to assist in a comprehensive understanding of exemplary embodiments of the invention as defined by the claims and their equivalents. The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the industry, or to enable others of ordinary skill in the art to understand the embodiments disclosed herein. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings but are merely used to enable a clear and consistent understanding of the invention. Accordingly, it should be apparent to those skilled in the art that the following description of exemplary embodiments of the present invention is provided for illustration only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layers at the interface of the two elements.

In the interest of not obscuring the presentation of embodiments of the present invention, in the following detailed description, some processing steps or operations that are known in the art may have been combined for presentation and illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The figures represent cross-section portions of a semiconductor chip or a substrate, such as a semiconductor wafer during fabrication, and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described. It will be understood that, although the terms first, second, etc. can be used herein to describe various elements, these elements should not be limited by these terms. These terms are only used to distinguish one element from another element. Thus, the first element discussed below could be termed a second element without departing from the scope of the present concept.

Selectively etching as used herein includes but is not limited to patterning using one of lithography, photolithography, an extreme ultraviolet (EUV) lithography process, or any other known semiconductor patterning process followed by one or more etching processes. Various materials are referred to herein as being removed or "etched" where etching generally refers to one or more processes implementing the removal of one or more materials while leaving other protected areas of the materials that are masked during the lithography processes unaffected. Some examples of etching processes include but are not limited to the following processes, such as a dry etching process using a reactive ion etch (RIE) or ion beam etch (IBE), a wet chemical etch process, or a combination of these etching processes. A dry etch may be performed using a plasma. Ion milling, sputter etching, or reactive ion etching (RIE) bombards the wafer with energetic ions of noble gases that approach the wafer approximately from one direction, and therefore, these processes are an anisotropic or a directional etching process.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In epitaxy or an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Reference is now made to the figures. The figures provide a schematic cross-sectional illustration of semiconductor devices at intermediate stages of fabrication, according to one or more embodiments of the invention. The device provides schematic representations of the devices of the invention and are not to be considered accurate or limiting with regards to device element scale.

Figure 1A:
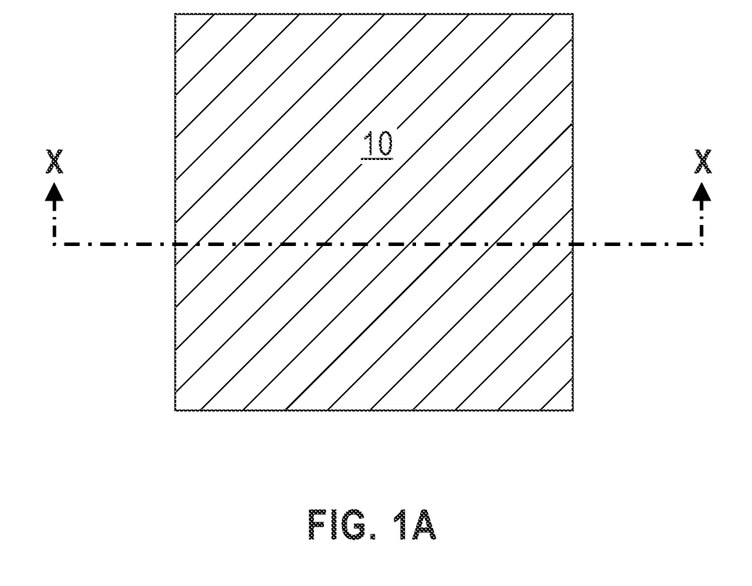
FIG. 1A depicts a top view of a first semiconductor substrate, in accordance with an embodiment of the present invention.

FIG. 1A depicts a top view of semiconductor substrate 10, in accordance with an embodiment of the present invention. In various embodiments, semiconductor substrate 10 has {100} crystalline surface orientation. As previously discussed, the crystalline surface orientation can be identified using standard crystallographic planes that are any set of parallel and equally spaced planes that may pass through the centers of atoms in crystals and can be identified using Miller Indices with the notation {hkℓ} to denote the set of all planes that are equivalent to (hkℓ) by the symmetry of the crystal lattice. As known to one skilled in the art, a {100} crystalline surface orientation includes the (1 0 0), (0 1 0), (0 0 1), (−1 0 0), (0 −1 0), and (0 0 −1) family of crystal planes.

A {100} crystalline surface orientation provides a preferred crystal orientation for an NFET electrical performance. Also, depicted in FIG. 1A is a location of the X-X section through semiconductor substrate 10 that will be used for the cross-sectional views illustrated in FIG. 2A and FIG. 4.

Semiconductor substrate 10 is composed of any semiconductor substrate material suitable for a substrate in a CMOS device, such as a but not limited to a horizontal gate-all-around (hGAA) device. In various embodiments, semiconductor substrate 10 is a silicon semiconductor material. In other embodiments, semiconductor substrate 10 is composed of a group IV semiconductor material (e.g., Ge), a group III-V semiconductor material (e.g., gallium arsenide), a group II-VI semiconductor material, or other known semiconductor material or compounds of any known semiconductor material used in semiconductor circuits where the groups are columns or groups of elements in the Periodic Table of Elements. In various embodiments, substrate 10 is a wafer or a portion of a wafer. In some embodiments, semiconductor substrate 10 is composed of a semiconductor material includes one or more of doped, undoped, or contains doped regions, undoped regions, stressed regions, or defect-rich regions. In some examples, semiconductor substrate 10 may include one or more other devices or transistors (not depicted). In an embodiment, semiconductor substrate 10 is one of a layered semiconductor substrate, such as a semiconductor-on-insulator substrate (SOI), germanium on insulator (GeOI), or silicon-on-replacement insulator (SRI).

Figure 1B:
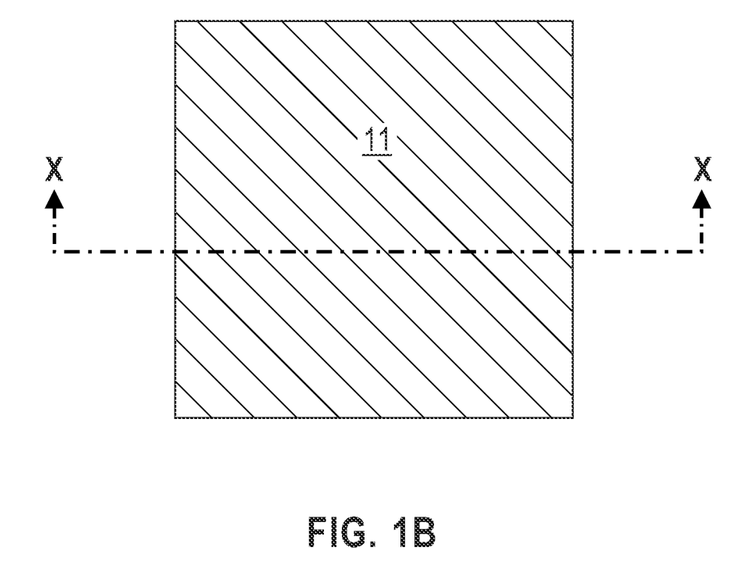
FIG. 1B depicts a top view of a second semiconductor substrate, in accordance with an embodiment of the present invention.

FIG. 1B depicts a top view of semiconductor substrate 11, in accordance with an embodiment of the present invention. In various embodiments, semiconductor substrate 11 has {110} crystalline surface orientation. A {110} crystalline surface orientation provides a preferred crystal orientation for a PFET electrical performance. As known to one skilled in the art, a {110} crystalline surface orientation includes the (1 1 0), (1 −1 0), (1 0 1), (1 0 −1), (0 1 1), (0 1 −1) family of crystal planes. In an embodiment, semiconductor substrate 11 has a {111} crystalline surface orientation. Also, depicted in FIG. 1B is a location of a Y-Y section through semiconductor substrate 11 that will be used to depict the cross-sectional views illustrated in FIG. 2B, FIG. 3, and FIG. 4.

Semiconductor substrate 11 is composed of any semiconductor substrate material suitable for a substrate in a Complementary Metal-Oxide Semiconductor (CMOS) device, such as a but not limited to a hGAA device with a PFET device structure. In various embodiments, semiconductor substrate 11 is a silicon semiconductor material. In other embodiments, semiconductor substrate 11 is composed of a group IV semiconductor material (e.g., Ge), a group III-V semiconductor material, a group II-VI semiconductor material, or other known semiconductor material or compounds of any known semiconductor material used in semiconductor circuits where the groups are columns or groups of elements in the Periodic Table of Elements. In various embodiments, semiconductor substrate 11 is a wafer or a portion of a wafer. In some embodiments, semiconductor substrate 11 includes one or more of doped, undoped, or contains doped regions, undoped regions, stressed regions, or defect-rich regions. In some examples, semiconductor substrate 11 may include one or more other devices or transistors (not depicted). In an embodiment, substrate 11 is one of a layered semiconductor substrate, such as a semiconductor-on-insulator substrate (SOI), germanium on insulator (GeOI), or silicon-on-replacement insulator (SRI).

Figure 2A:
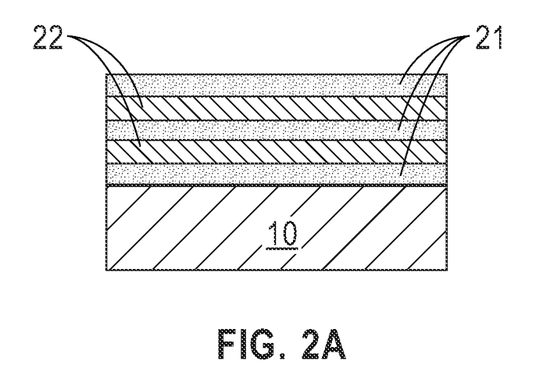
FIG. 2A depicts a cross-sectional view of a semiconductor structure after forming a first nanosheet stack on the first semiconductor substrate, in accordance with an embodiment of the present invention.

FIG. 2A depicts a cross-sectional view of a semiconductor structure after forming a first nanosheet stack composed of alternating nanosheet layers of sacrificial material 21 and channel material 22 on semiconductor substrate 10, in accordance with an embodiment of the present invention. In various embodiments, the first nanosheet stack on semiconductor substrate 10 depicted in FIG. 2A is comprised of alternating nanosheet layers of sacrificial material 21 and channel material 22 where channel material 12 resides between two nanosheet layers of sacrificial material 21. The nanosheet stack can be formed by epitaxially growing each layer of the nanosheet stack. As depicted, the first layer of sacrificial material 21 can be epitaxially grown on semiconductor substrate 10. Since semiconductor substrate 10 has a {100} crystalline surface orientation, sacrificial material 21 which can be a semiconductor material, such as SiGe grown on semiconductor substrate 10 will have a {100) crystalline surface orientation. A first nanosheet layer of channel material 22 can be grown on the first layer of sacrificial material 21 and will also have a {100} crystalline surface orientation. Subsequent layers of sacrificial material 21 are grown by epitaxy on layers of channel material 22, which in turn, are each grown on a layer of sacrificial material 21. Each of the nanosheet layers of the nanosheet stack grown by epitaxy above semiconductor substrate 10 will have a {100} crystalline surface orientation. As known to one skilled in the art, a semiconductor material grown by epitaxy can produce the same crystalline surface orientation and characteristics as the semiconductor surface or semiconductor substrate on which it is formed. In various embodiments, a layer of sacrificial material 21 is both the bottom and the top nanosheet layer of the nanosheet stack on semiconductor substrate 10.

Sacrificial material 21 is a layer of a sacrificial material. Sacrificial material 21 may be composed of a semiconductor material. In various embodiments, sacrificial material 21 is composed of SiGe. The composition of SiGe may vary depending on the semiconductor chip application. For example, sacrificial material 21 can be comprised of $Si_xGe_y$, where x and y represent a relative atomic concentration of silicon (Si) and germanium (Ge), respectively. In some embodiments, x and y are less than 1 and their sum is equal to 1. In an embodiment, sacrificial material 21 is composed of another material capable of uniform deposition in a nanosheet layer that is compatible with semiconductor manufacturing processes and is suitable for a selective etch of sacrificial material 21 that is between channel layers 22 in later semiconductor device formation steps.

A thickness of sacrificial material 21 can be dictated by subsequent process steps and electrical requirements of the completed stacked CMOS device depicted in FIG. 8. For example, the thickness of sacrificial material 21 is between 5 and 20 nanometers but is not limited to these thicknesses.

Channel material 22 can be composed of any semiconductor material suitable for forming a channel in a CMOS device, such as an NFET hGAA device. In various embodiments, channel material 22 is composed of silicon but is not limited to silicon in other embodiments. As depicted, each nanosheet layer of channel material 22 is surrounded above and below by a nanosheet layer of sacrificial material 21. In one embodiment, two different and alternating semiconductor materials can be used for channel material 22 (i.e., channel material 22A and channel material 22B not depicted). For example, the thickness of channel material 22 is between 3 and 10 nanometers but, is not limited to this range of thickness.

Figure 2B:
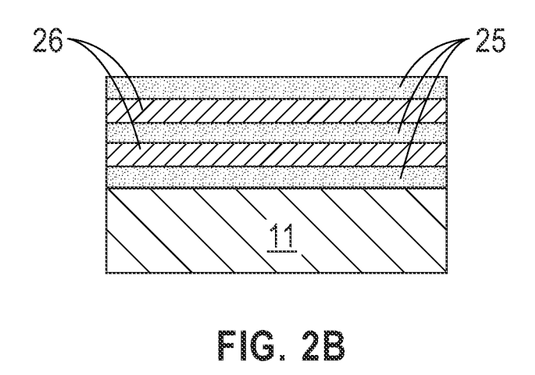
FIG. 2B depicts a cross-sectional view of a semiconductor structure after forming a second nanosheet stack on the second semiconductor substrate, in accordance with an embodiment of the present invention.

FIG. 2B depicts a cross-sectional view of the semiconductor structure after forming a second nanosheet stack on semiconductor substrate 11, in accordance with an embodiment of the present invention. In various embodiments, the second nanosheet stack on semiconductor substrate 11 is composed of alternating nanosheet layers of sacrificial layer 25 and channel material 26 where channel material 26 resides between two nanosheet layers of sacrificial layer 25. The nanosheet stack can be formed by epitaxially growing each nanosheet layer of the nanosheet stack where the first nanosheet layer of sacrificial layers 25 is grown on semiconductor substrate 11. Since semiconductor substrate 11 has a {110} crystalline surface orientation, sacrificial layer 25 which can be a semiconductor material, such as SiGe epitaxially grown on semiconductor substrate 11 can have a {110) crystalline surface orientation.

A first nanosheet layer of channel material 26 can be grown on the first layer of sacrificial layer 25 and channel material 26 grown on sacrificial layer 25 with a 11101 crystalline surface orientation will also have a {110} crystalline surface orientation. Subsequent layers of sacrificial layer 25 are grown by epitaxy on layers of channel material 26, which in turn, are each grown on a layer of sacrificial material 26. Each of the nanosheet layers formed by epitaxy above semiconductor substrate 11 can have a {110} crystalline surface orientation. In various embodiments, a layer of sacrificial layer 25 is both the bottom and the top nanosheet layer of the nanosheet stack on substrate 11.

Sacrificial layer 25 is a layer of a sacrificial material. Sacrificial layer 25 may be composed of a semiconductor material. In various embodiments, sacrificial layer 25 is composed of SiGe. The composition of SiGe may vary depending on the semiconductor chip application. For example, sacrificial layer 25 can be comprised of $Si_xGe_y$, where x and y represent a relative atomic concentration of silicon (Si) and germanium (Ge), respectively. In some embodiments, x and y are less than 1 and their sum is equal to 1. In an embodiment, sacrificial layer 25 is composed of another material capable of uniform deposition in a nanosheet layer that is compatible with semiconductor manufacturing processes and is suitable for a selective etch of sacrificial layers 25 that are between channel layers 26 in later semiconductor device formation steps. In various embodiments, the material composing sacrificial layer 25 can be the same material as sacrificial material 21 or a different material. In various embodiments, sacrificial layer 25 will have a different crystal orientation than sacrificial material 21.

A thickness of sacrificial layer 25 can be dictated by subsequent process steps and electrical requirements of the completed PFET CMOS device. The thickness of sacrificial layer 25 is between 5 and 20 nanometers but is not limited to these thicknesses.

Channel material 26 can be composed of any semiconductor material suitable for forming a channel in a CMOS device, such as a PFET hGAA device. In various embodiments, channel material 26 is composed of silicon but is not limited to silicon in other embodiments. Each nanosheet layer of channel material 26 is surrounded above and below by a nanosheet layer of sacrificial layer 25. As depicted in FIG. 2B, each layer of channel material 26 alternates with layers of sacrificial layer 25. In one embodiment, two different and alternating semiconductor materials can be used for channel material 26 (i.e., channel material 26A and channel material 26B not depicted). The thickness of channel material 26 is between 3 and 10 nanometers but, is not limited to this range of thickness.

Figure 3:
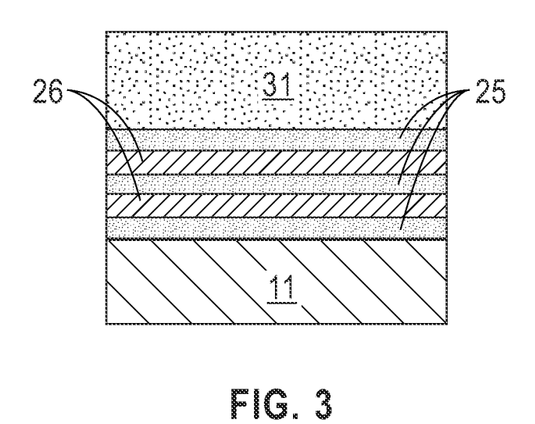
FIG. 3 depicts a cross-sectional view of the semiconductor structure after forming an oxide layer on the second nanosheet stack on the second semiconductor substrate, in accordance with an embodiment of the present invention.

FIG. 3 depicts a cross-sectional view of the semiconductor structure after forming a dielectric layer 31 (e.g., a silicon oxide, another oxide material, a nitride material, or another suitable dielectric material) on the second nanosheet stack on semiconductor substrate 11, in accordance with an embodiment of the present invention. As depicted, FIG. 3 semiconductor substrate 11 with multiple alternating nanosheet layers of sacrificial layer 25 and channel material 26, and dielectric layer 31 on the top nanosheet layer of channel material 26. Using a known deposition process, such as chemical vapor deposition (CVD), physical vapor deposition (PVD), or any other known dielectric material deposition process used in semiconductor manufacturing, dielectric layer 31 can be deposited on the top of the second nanosheet stack. While FIG. 3 depicts dielectric layer 31 on the top nanosheet layer of sacrificial layer 25 in the second nanosheet stack, in other embodiments, dielectric layer 31 is deposited on the top nanosheet layer of sacrificial material 21 in the first nanosheet stack depicted in FIG. 2A.

Figure 4:
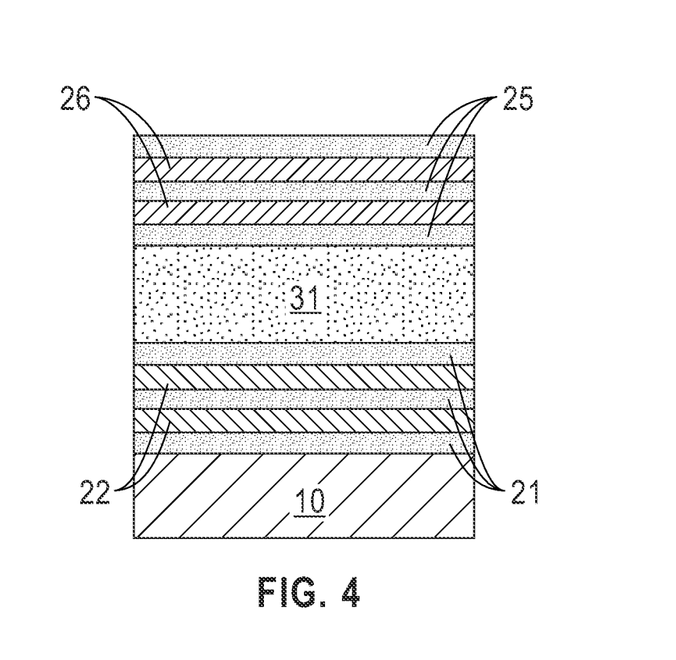
FIG. 4 depicts a cross-sectional view of the semiconductor structure after joining the second nanosheet stack to the first nanosheet stack, in accordance with an embodiment of the present invention.

FIG. 4 depicts a cross-sectional view of the semiconductor structure after joining the second nanosheet stack to the first nanosheet stack, in accordance with an embodiment of the present invention. As depicted, FIG. 4 includes the first nanosheet stack composed of sacrificial material 21 and channel material 22 on semiconductor substrate 10, dielectric layer 31 between the first nanosheet stack and the second nanosheet stack, and the second nanosheet stack that is composed of sacrificial layer 25 and channel material 26. Using known wafer bonding processes, the top surface of dielectric layer 31 on sacrificial layer 25 of the second nanosheet stack is bonded to sacrificial material 21 in the first nanosheet stack on semiconductor substrate 10. In other embodiments, when dielectric layer 31 is deposited on the first nanosheet stack, dielectric layer 31 is bonded to the top of the second nanosheet stack. In other embodiments, a dielectric layer can be deposited on the top surfaces of each nanosheet stack on each substrate, and then two nanosheet stacks are joined together by bonding the two dielectric layers. As depicted, after bonding dielectric layer 31 to sacrificial material 21, semiconductor substrate 11 can be removed using known semiconductor substrate or wafer removal processes, such as a known handler wafer or substrate release process. In other embodiments, semiconductor substrate 10 can be removed rather than semiconductor substrate 11.

After joining the two nanosheet stacks that are separated by dielectric layer 31, a single semiconductor substrate structure can be formed with two vertically aligned nanosheet stacks. Using this method, one nanosheet stack of channel and sacrificial nanosheet layers have a first crystalline surface orientation and the second nanosheet stack of channel, and sacrificial material nanosheet layer have a second crystalline surface orientation. More specifically, as depicted in FIG. 4, the semiconductor substrate structure on semiconductor substrate 10 has the first nanosheet stack composed of alternating layers of sacrificial material 21 and channel material 22 where each layer of sacrificial material 21 and channel material 22 has a {100} crystalline surface orientation. The first nanosheet stack is separated by dielectric layer 31 from the second nanosheet stack that is composed of alternating layers of sacrificial layer 25 and channel material 26 that each have a {110} crystalline surface orientation.

After bonding dielectric layer 31 to sacrificial material 21 in the nanosheet stack composed of sacrificial material 21 and channel material 22, semiconductor substrate 11 is removed (e.g., instead of removing semiconductor substrate 11 as depicted in FIG. 4). In these embodiments, the bottom nanosheet stack on semiconductor substrate 10 can provide a {100} crystalline surface orientation preferred for NFET CMOS devices and the second or top nanosheet stack can provide a {110} crystalline surface orientation preferred for PFET CMOS devices.

In other embodiments, the base semiconductor substrate is semiconductor substrate 11 that has a {110} crystalline surface orientation and in this embodiment, semiconductor substrate 10 is removed instead of semiconductor substrate 11. For example, semiconductor substrate 11 with a {110} crystalline surface orientation is under the first nanosheet stack with a preferred {110} crystalline surface orientation for PFET CMOS devices.

The semiconductor substrate structure depicted in FIG. 4 includes semiconductor substrate 10 covered by a nanosheet stack with a {100} crystalline surface orientation that is preferred for NFET CMOS devices. The semiconductor structure depicted in FIG. 4 also provides a second nanosheet stack directly above dielectric layer 31 with a {110} crystalline surface orientation that is preferred for PFET CMOS devices.

In this way, the semiconductor substrate structure depicted in FIG. 4 can provide the first nanosheet stack on semiconductor substrate 10 where the first nanosheet stack formed on semiconductor substrate 10 has a {100} crystalline surface orientation that will provide good or optimal electrical performance for NFET devices while also providing, on the same semiconductor substrate structure, the second nanosheet stack with a {110} crystalline surface orientation will provide an improved or optimal electrical performance for PFET CMOS devices.

The method of forming the semiconductor structure depicted in FIG. 4 provides a way to form a single semiconductor substrate with two nanosheet stacks with two different crystalline surface orientations that are electrically isolated by dielectric layer 31 between the two nanosheet stacks.

Figure 5:
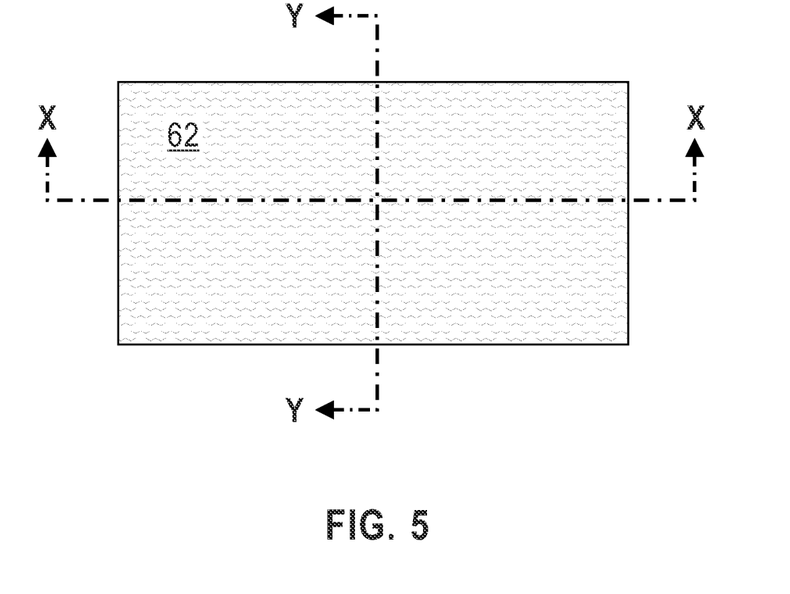
FIG. 5 depicts a top view of the semiconductor structure after depositing a hardmask material on an exposed top surface of the second nanosheet stack, in accordance with an embodiment of the present invention.

FIG. 5 depicts a top view of the semiconductor structure after depositing hardmask 62 on an exposed top surface of the second nanosheet stack, in accordance with an embodiment of the present invention. FIG. 5 depicts a step in forming a stacked CMOS device from the semiconductor substrate structure depicted in FIG. 4. Using known deposition processes, such as CVD or PVD, a layer of hardmask 62 is deposited on the exposed top nanosheet layer of sacrificial layer 25. As depicted in FIG. 5, the top view of the semiconductor structure after hardmask 62 deposition illustrates a location of an X-X cross-section that is perpendicular to a future gate structure of a CMOS device formed in later process steps and a location of a Y-Y cross-section that is parallel to a future gate structure of the CMOS device depicted later in FIG. 10B.

Figure 6A:
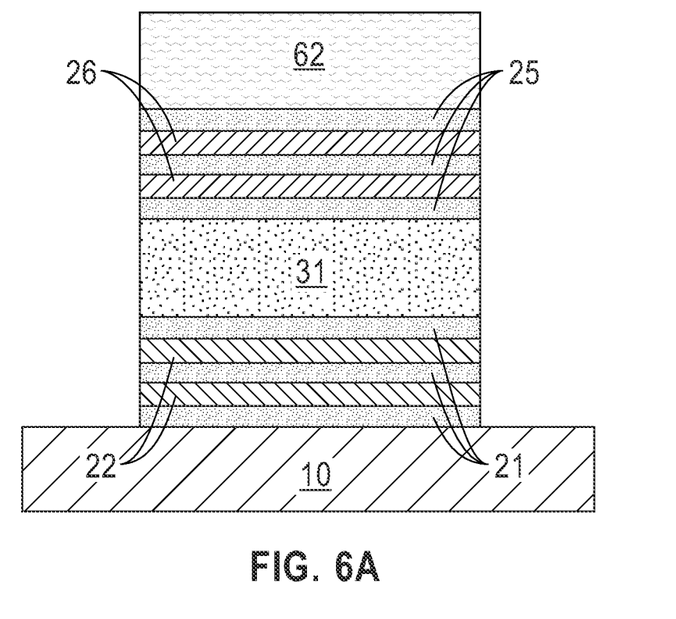
FIG. 6A depicts a cross-sectional view in the X-X direction depicted in FIG. 5 of the semiconductor structure after removing portions of the hardmask, the second nanosheet stack, the oxide layer, and the first nanosheet stack, in accordance with an embodiment of the present invention.

FIG. 6A depicts a cross-sectional view in the X-X direction of the semiconductor structure after removing portions of hardmask 62, the second nanosheet stack composed of sacrificial layer 25 and channel material 26, dielectric layer 31, and the first nanosheet stack composed of sacrificial material 21 and channel material 22, in accordance with an embodiment of the present invention. The top layer of sacrificial layer 25 of the second nanosheet stack is patterned, for example using lithography and selectively etched, for example using a reactive ion etching process to remove portions of the second nanosheet stack, dielectric layer 31, and the first nanosheet stack on semiconductor substrate 10. As depicted, FIG. 6A includes the remaining portion of the first nanosheet stack (i.e., alternating layers of sacrificial material 21 and channel material 22) on a portion of semiconductor substrate 10, the remaining portion of dielectric layer 31, and the remaining portion of the second nanosheet stack (i.e., alternating layer of sacrificial layer 25 and channel material 26).

Figure 6B:
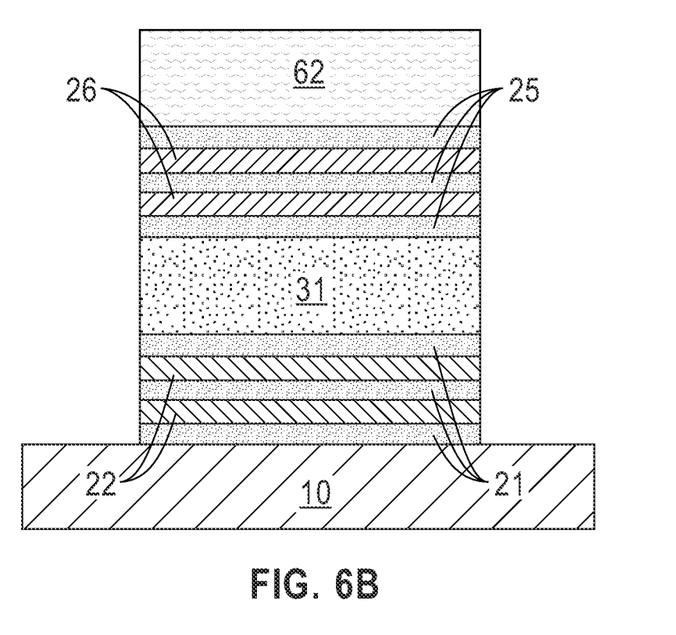
FIG. 6B depicts a cross-sectional view in the Y-Y direction depicted in FIG. 5 of the semiconductor structure after removing portions of the hardmask, the second nanosheet stack, the oxide layer, and the first nanosheet stack, in accordance with an embodiment of the present invention.

FIG. 6B depicts a cross-sectional view in the Y-Y direction of the semiconductor structure after removing portions of hardmask 62, the second nanosheet stack composed of sacrificial layer 25 and channel material 26, dielectric layer 31, and the first nanosheet stack composed of sacrificial material 21 and channel material 22, in accordance with an embodiment of the present invention. As depicted, FIG. 6B illustrates the elements depicted in FIG. 6A. Using the processes previously discussed above with respect to FIG. 6A, portions of the second nanosheet stack, dielectric layer 31, and the first nanosheet stack are selectively removed above portions of semiconductor substrate 10.

Figure 7A:
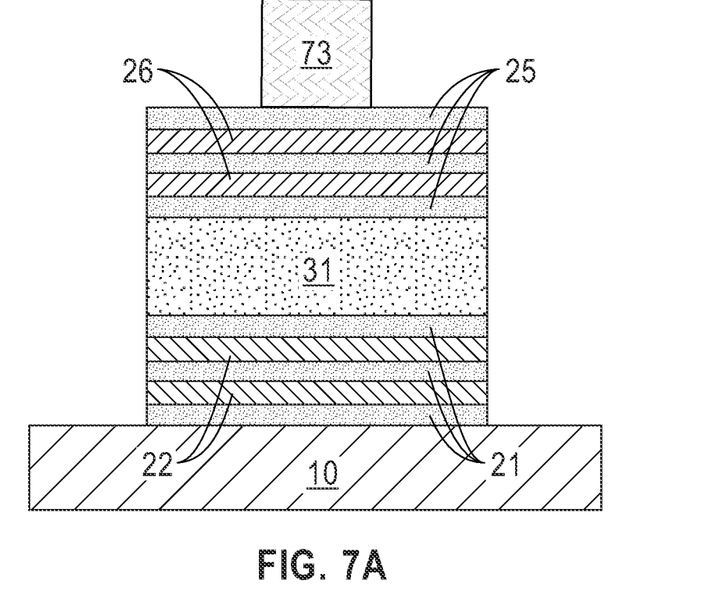
FIG. 7A depicts a cross-sectional view in the X-X direction depicted in FIG. 5 after forming a dummy gate structure, in accordance with an embodiment of the present invention.

FIG. 7A depicts a cross-sectional view in the X-X direction after forming dummy gate structure 73, in accordance with an embodiment of the present invention. As depicted, FIG. 7A includes the elements of FIG. 6A and dummy gate structure 73. Using known processes and materials to deposit dummy gate structure 73, dummy gate structure 73 is formed on the top layer of sacrificial layer 25. In some embodiments, a layer of gate dielectric material, such as a high k dielectric material may be deposited on the top layer of sacrificial layer 25 followed by a deposition of a dummy gate material for dummy gate structure 73. The top surface of dummy gate structure 73 can be patterned and etched, for example, using RIE, to for dummy gate structure 73 on a portion of the top nanosheet layer of sacrificial layer 25 as depicted in FIG. 6A.

Figure 7B:
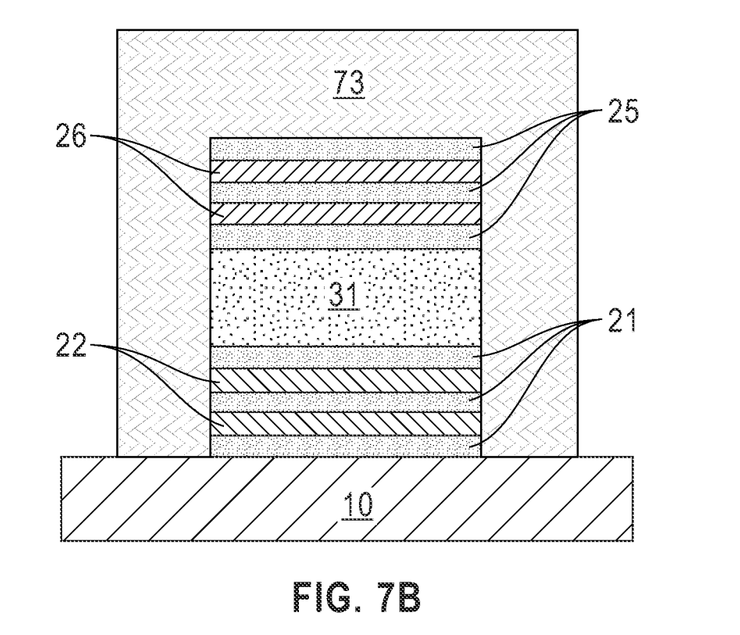
FIG. 7B depicts a cross-sectional view in the Y-Y direction depicted in FIG. 5 after forming a dummy gate structure, in accordance with an embodiment of the present invention.

FIG. 7B depicts a cross-sectional view in the Y-Y direction after forming dummy gate structure 73, in accordance with an embodiment of the present invention. As depicted in a cross-sectional view that is parallel to dummy gate structure 73, using the processes discussed above with reference to FIG. 7A, a layer of a dummy gate material may be deposited on sacrificial layer 25 and around the remaining portions of the two nanosheet stacks. In some cases, an optional layer of a gate dielectric material covered a layer of dummy gate material may be deposited on sacrificial layer 25 and around the exposed sidewalls of the nanosheet stacks. The top surface of dummy gate structure 73 is patterned and selectively etched leaving a portion of dummy gate structure 73 over sacrificial layer 25, over a portion of semiconductor substrate 10, and around the sidewalls of the first nanosheet stack, the second nanosheet stack, and dielectric layer 31 as depicted in FIG. 7B.

Figure 8A:
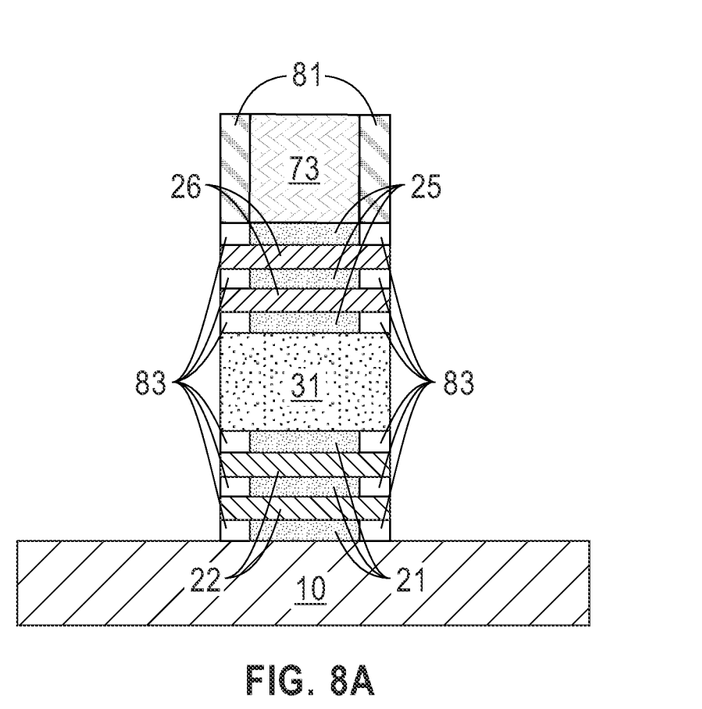
FIG. 8A depicts a cross-sectional view in the X-X direction depicted in FIG. 5 after forming spacers, in accordance with an embodiment of the present invention.

FIG. 8A depicts a cross-sectional view in the X-X direction depicted in FIG. 5 after forming protective spacer 81 and inner spacers 83, in accordance with an embodiment of the present invention. As depicted, FIG. 8A illustrates the elements of FIG. 7A and protective spacer 81. Protective spacer 81 can be formed on a portion of sacrificial layer 25 around dummy gate structure 73 as depicted using known spacer deposition processes, such as atomic layer deposition (ALD), CVD, or plasma-enhanced CVD (PECVD).

After depositing protective spacer 81, exposed portions of the second nanosheet stack (i.e., nanosheet layer of sacrificial layer 25 and channel material 26), portions of dielectric layer 31 under the exposed portions of the second nanosheet stack, and the portions of the first nanosheet stack (i.e., nanosheet layers of sacrificial material 21 and channel material 22) under the exposed portions of the first nanosheet stack and under the exposed portions of dielectric layer 31 are removed, for example, using RIE or IBE.

After removing the portions of the two nanosheet stacks and dielectric layer 31 not covered by protective spacer 81 or dummy gate structure 73, a lateral etching process, for example, using a vapor phase hydrochloric acid (HCl) dry etch or a wet etch process containing a mix of ammonia and hydrogen peroxide or another suitable etching process for removing an outside edge portion of sacrificial layer 25 and sacrificial material 21. After performing the lateral etch, inner spacers 83 can be deposited in the recesses formed along an outer edge portion of each layer of sacrificial layer 25 and sacrificial material 21. Each of inner spacers 83 horizontally abuts one of sacrificial layer 25 or sacrificial material 21. Inner spacers 83 vertically separate the outside edges of one of channel material 26 or channel material 22 from other adjacent channel material layers as depicted in FIG. 8A. Inner spacers 83 create a horizontal separation of each layer of sacrificial material (e.g., sacrificial layers 21 and 25) from the outside edge of the remaining portions of the nanosheet stacks and in the final device depicted in FIG. 10A and 10B, that separates the metal gate from the source/drains.

Figure 8B:
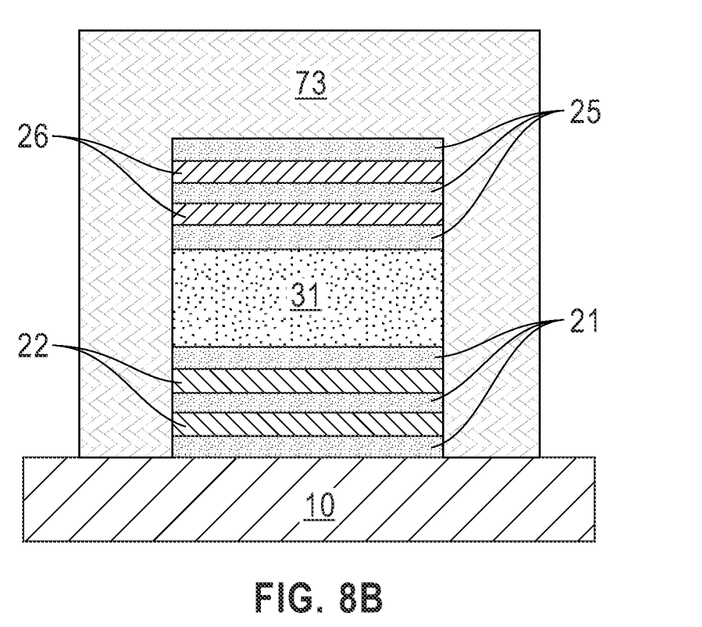
FIG. 8B depicts a cross-sectional view in the Y-Y direct depicted in FIG. 5 after forming spacers, in accordance with an embodiment of the present invention.

FIG. 8B depicts a cross-sectional view in the Y-Y direction after forming protective spacer 81 (not depicted in FIG. 8B) and inner spacers 83 (not depicted in FIG. 8B), in accordance with an embodiment of the present invention. As depicted, FIG. 8B includes the elements of FIG. 7B.

Figure 9A:
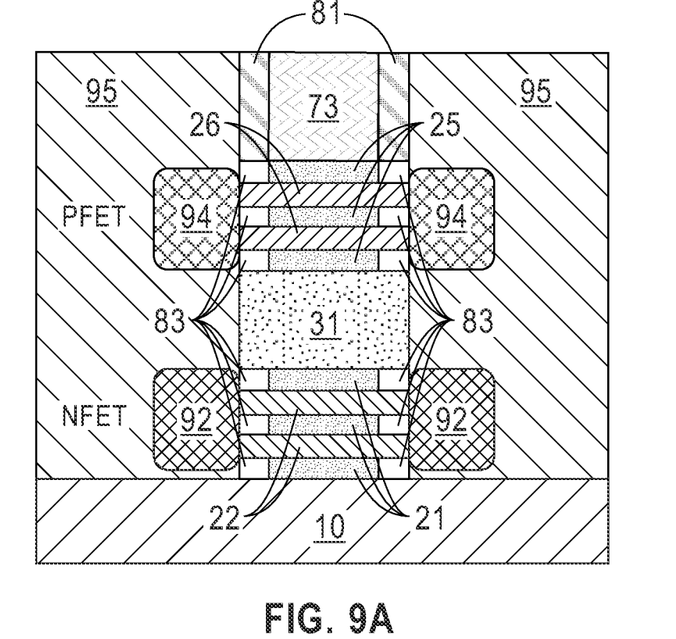
FIG. 9A depicts a cross-sectional view in the X-X direction of the semiconductor structure after forming source/drains for an n-type field-effect device and a p-type field-effect device and a replacement gate structure, in accordance with an embodiment of the present invention.

FIG. 9A depicts a cross-sectional view in the X-X direction of the semiconductor structure after forming source/drains (S/D) 94 for a n-type field-effect device and S/D 92 for a p-type field-effect device, in accordance with an embodiment of the present invention. Using epitaxy, S/D 92 is grown on the exposed sidewall surfaces of channel material 22 with a {100} crystalline surface orientation and inner spacer 83 of the first nanosheet stack for the NFET device. Using epitaxy, S/D 94 is grown on the exposed sidewall surfaces of channel material 26 with a {110} crystalline surface orientation and inner spacer 83 of the second nanosheet stack for the PFET device. In some embodiments, S/D 92 is doped with an n-type dopant and S/D 94 is doped with a p-type dopant.

Figure 9B:
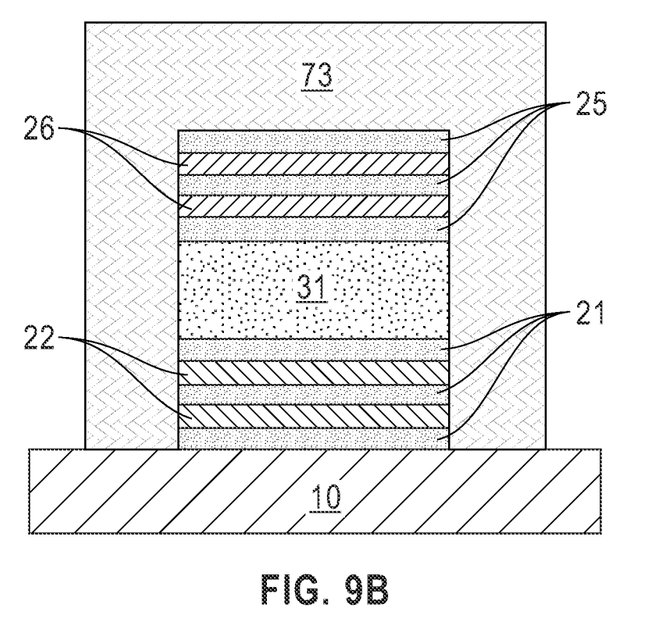
FIG. 9B depicts a cross-sectional view in the Y-Y direction of the semiconductor structure after forming source/drains for the n-type field-effect device and the p-type field-effect device and a replacement gate structure, in accordance with an embodiment of the present invention.

FIG. 9B depicts a cross-sectional view in the Y-Y direction of the semiconductor structure after forming source/drains (S/D) 94 (not depicted in FIG. 9B) for an n-type field-effect device and S/D 92 (not depicted in FIG. 9B) for a p-type field-effect, in accordance with an embodiment of the present invention. As depicted, FIG. 9B illustrates essentially the same elements as FIG. 8B in the cross-section parallel to the gate or dummy gate structure 73.

Figure 10A:
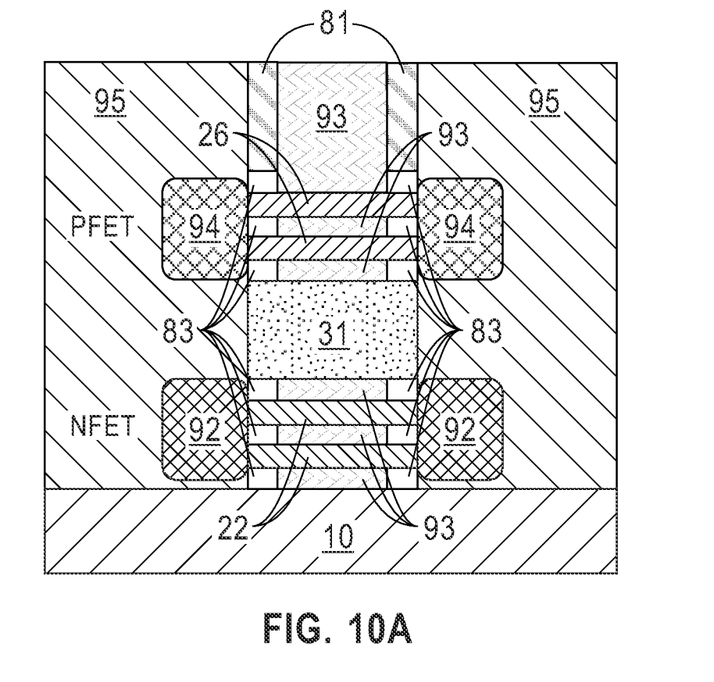
FIG. 10A depicts a cross-sectional view in the X-X direction of the semiconductor structure after forming a replacement gate structure, in accordance with an embodiment of the present invention.

FIG. 10A depicts a cross-sectional view in the X-X direction of the semiconductor structure after forming replacement gate structure 93, in accordance with an embodiment of the present invention. As depicted in the cross-sectional view perpendicular to replacement gate structure 93, FIG. 10A illustrates a portion of an NFET hGAA device formed with the first nanosheet stack composed of nanosheet layers of channel material 22 with a {100} crystalline surface orientation, replacement gate structure 93, inner spacers 83, and S/D 92. The NFET hGAA device, as depicted, is above a portion of semiconductor substrate 10 and below the PFET hGAA device. The PFET hGAA device, as depicted, is on a portion of dielectric layer 31 and is formed from the second nanosheet stack composed of nanosheet layers of channel material 26 with a {110} crystalline surface orientation, S/D 94, inner spacers 83, and replacement gate structure 93. As depicted, FIG. 10A also includes ILD 95 above exposed portions of semiconductor substrate 10 and surrounding the NFET hGAA device, the PFET hGAA device, and protective spacer 81 around the upper portion of replacement gate structure 93.

The semiconductor structure depicted in FIG. 10A can be formed by depositing ILD 95 above exposed portions of semiconductor substrate 10 and around the first nanosheet stack with exposed inner spacers 83, dielectric layer 31, and the second nanosheet stack with exposed inner spacers 83, and protective spacer 81.

Dummy gate structure 73 can be removed using a dry or a wet etching process. Sacrificial layers 21 and 25 are removed using known dry or wet etching processes used in nanosheet semiconductor device formation.

After removing dummy gate structure 73 and sacrificial layers 21 and 25, replacement gate structure 93 can be formed. In some examples, using known semiconductor manufacturing processes for forming replacement gate structure 93 with a metal gate electrode (not depicted), a gate dielectric material (not depicted) or a high k metal gate dielectric (e.g., HfO, AlO, ZrO, TaO, etc.) may be deposited first on exposed surfaces in the two nanosheet stacks and between protective spacer 81, for example, using ALD or CVD. A metal gate electrode material (e.g., TiN, TiAl, TiC, TaN, Ta, Al, W, Ru, etc.) is deposited to form replacement gate structure 93.

Figure 10B:
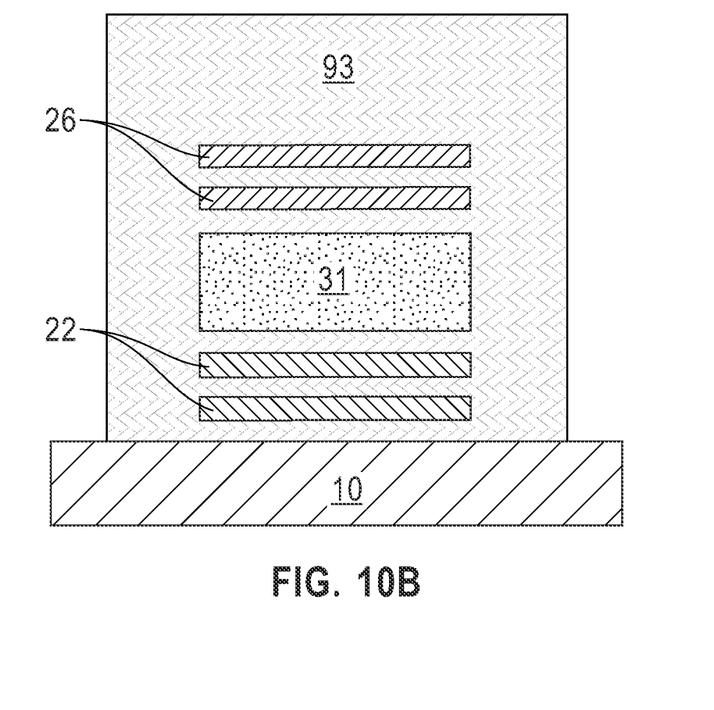
FIG. 10B depicts a cross-sectional view in the Y-Y direction of the semiconductor structure after forming a replacement gate structure, in accordance with an embodiment of the present invention.

FIG. 10B depicts a cross-sectional view in the Y-Y direction of the semiconductor structure after forming replacement gate structure 93, in accordance with an embodiment of the present invention. FIG. 10B is a cross-sectional view parallel the gate of a semiconductor device structure with an NFET hGAA device and a PFET hGAA device on semiconductor substrate 10. As depicted, the elements illustrated in FIG. 10B are essentially the same as the elements illustrated in FIG. 9B except that ILD 95 is deposited, dummy gate structure 73 is removed, and replaced, each of sacrificial material 21 and sacrificial layer 25 are removed and a metal gate structure labeled as replacement gate structure 93 is added to replace dummy gate structure 73 between channel materials 22 and 25, respectively. The semiconductor device structure depicted in FIG. 10B is formed with the processes discussed above with reference to FIG. 10A.

FIG. 10B illustrates a portion of an NFET hGAA device formed with the first nanosheet stack composed of nanosheet layers of channel material 22 with a {100} crystalline surface orientation with replacement gate structure 93 on semiconductor substrate 10 with inner spacers 83 and S/D 92. FIG. 10B also illustrates a portion of a PFET hGAA device above the NFET hGAA device, where the PFET hGAA is formed from the second nanosheet stack composed of nanosheet layers of channel material 26 with a {110} crystalline surface orientation with replacement gate structure 93 on dielectric layer 31, inner spacers 83, and S/D 94. As depicted, FIG. 10B includes ILD 95 above exposed portions of semiconductor substrate 10 and surrounding the NFET hGAA device, the PFET hGAA device, and protective spacer 81 around the upper portion of replacement gate structure 93.

Dummy gate structure 73 can be removed after depositing ILD 95 using a known dry etching process (e.g., RIE) or a wet etching process. Sacrificial layers 21 and 25 are removed using known dry or wet etching processes.

After removing dummy gate structure 73 and sacrificial layers 21 and 25, replacement gate structure 93 can be formed. In some examples, using known semiconductor processes for metal gate formation, a thin layer of a gate dielectric material (not depicted), such as a high k dielectric material (e.g., HfO, Al0, ZrO, TaO, etc.) may be deposited on exposed surfaces in the two nanosheet stacks, inner spacers 83, and protective spacer 81, for example, using ALD or CVD. A metal gate electrode material (e.g., TiN, TiAl, TiC, TaN, Ta, Al, W, Ru, etc.) can be deposited on the gate dielectric material to form replacement gate structure 93.

In this way, the semiconductor device structures as depicted in FIG. 10A and 10B provide a stacked CMOS device. The stacked CMOS device as depicted in FIGS. 10A and 10B are hGAA devices with a preferred crystal orientation in each of the NFET hGAA device on semiconductor substrate 10 and the PFET hGAA device above the NFET hGAA device. Each of the NFET and the PFET hGAA devices can have the preferred crystal orientation by using two different nanosheet stacks that are each formed on a different semiconductor substrate with different crystal orientations. Using the methods discussed in embodiments of the present invention, an NFET hGAA device with a preferred {100} crystalline surface orientation and a PFET hGAA device with a preferred {110} crystalline surface orientation can be vertically aligned and formed on a single semiconductor substrate using two nanosheet stacks with two different crystal orientations The methods described herein can be used in the fabrication of integrated circuit chips or semiconductor chips. The resulting semiconductor chips can be distributed by the fabricator in raw wafer form (that is, as a single wafer that has multiple unpackaged chips), as a bare die, or in a packaged form. In the latter case, the semiconductor chip is mounted in a single chip package (such as a plastic carrier, with leads that are affixed to a motherboard or other higher-level carrier) or in a multichip package (such as a ceramic carrier that has either or both of surface interconnections or buried interconnections). In any case, the semiconductor chip is then integrated with other semiconductor chips, discrete circuit elements, and/or other signal processing devices as part of either (a) an intermediate product, such as a motherboard, or (b) an end product. The end product can be any product that includes semiconductor chips, ranging from toys and other low-end applications to advanced computer products having a display, memory, a keyboard or other input device, and a central processor.

What is claimed is:

1. A semiconductor device comprising:
    a semiconductor substrate with a first crystalline surface orientation;
    a first type field-effect transistor directly on the semiconductor substrate and directly under a dielectric material contacting a second type field-effect transistor, wherein the first type field-effect transistor with the first crystalline surface orientation in a first plurality of nanosheet channels; and
    the second type field-effect transistor directly on the dielectric material with a second crystalline surface orientation in a second plurality of nanosheet channels, wherein the second plurality of nanosheet channels are parallel to the semiconductor substrate.

2. The semiconductor device of claim 1, wherein the first field-effect transistor and the second field-effect transistor are each a horizontal gate-all-around devices.

3. The semiconductor device of claim 1, wherein the first type field-effect transistor is a p-type field-effect transistor with a {110} crystalline surface orientation in the first plurality of nanosheet channels.

4. The semiconductor device of claim 1, wherein the first type field-effect transistor is an n-type field-effect transistor with a {100} crystalline surface orientation in the second plurality of nanosheet channels.

5. The semiconductor device of claim 1, wherein the first type field-effect transistor and the second type field-effect transistor are vertically stacked.

6. The semiconductor device of claim 1, wherein the second type field-effect transistor is a field-effect transistor selected from the group consisting of a p-type field-effect transistor and an n-type field-effect transistor.

7. The semiconductor device of claim 6, wherein the second type field-effect transistor is a field-effect transistor selected from the group consisting of a p-type field-effect transistor and an n-type field-effect transistor.

8. The semiconductor device of claim 7, wherein the second type field-effect transistor is the p-type field-effect transistor and the first type field-effect transistor is the n-type field-effect transistor.

9. The semiconductor device of claim 1, wherein the first type field-effect transistor and the second type field-effect transistor are a complementary metal-oxide-semiconductor device (CMOS) device.

10. The semiconductor device of claim 1, wherein the first crystalline surface orientation is selected from the group consisting of a {110} crystalline surface orientation and a {100} crystalline surface orientation.

11. The semiconductor device of claim 6, wherein the first type field-effect transistor is the p-type field-effect transistor, further comprising:
    the p-type transistor is directly on the semiconductor substrate with a {110} crystalline surface orientation;
    the dielectric material is directly on the p-type field-effect transistor; and
    the second type field-effect transistor is directly on the dielectric material, wherein the second type field-effect transistor is the n-type field-effect transistor with a {100} crystalline surface orientation in the first plurality of nanosheet channels.

12. The semiconductor device of claim 6, wherein the first type field-effect transistor is the n-type field-effect transistor, further comprising:
    the n-type transistor is directly on the semiconductor substrate with a {100} crystalline surface orientation;
    the dielectric material is directly on the n-type field-effect transistor; and
    the second type field-effect transistor is directly on the dielectric material, wherein the second type field-effect transistor is the n-type field-effect transistor with a {100} crystalline surface orientation in the first plurality of nanosheet channels.

13. The semiconductor device of claim 1, wherein the semiconductor substrate, the first plurality of nanosheet channels, and the second plurality of nanosheet channels are vertically aligned and parallel.

14. The semiconductor device of claim 1, wherein the semiconductor substrate with the first crystalline surface orientation is composed of a single semiconductor material layer.

* * * * *